United States Patent [19]

Nagata et al.

[11] 3,832,644

[45] Aug. 27, 1974

[54] SEMICONDUCTOR ELECTRONIC CIRCUIT WITH SEMICONDUCTOR BIAS CIRCUIT

[75] Inventors: Minoru Nagata, Kodaira; Takahiro Okabe, Hachio; Toshiaki Masuhara, Tokorozawa, all of Japan

[73] Assignee: Hitachi, Ltd., Tokyo, Japan

[22] Filed: Nov. 30, 1971

[21] Appl. No.: 203,355

[30] Foreign Application Priority Data

Nov. 30, 1970 Japan ............................ 45-104817

[52] U.S. Cl. ........................ 330/22, 330/18, 330/35, 330/70, 330/199

[51] Int. Cl. ............................................. H03f 1/32

[58] Field of Search .................... 330/35, 18, 70, 22

[56] References Cited

UNITED STATES PATENTS

| | | | |
|---|---|---|---|
| 2,929,997 | 3/1960 | Cluwer | 330/18 |
| 3,638,129 | 1/1972 | Pryer | 330/9 |
| 3,643,253 | 2/1972 | Blank et al. | 330/30 D X |
| 3,649,843 | 3/1972 | Redwine et al. | 330/35 X |
| 3,678,407 | 7/1972 | Ahorns | 230/35 |

*Primary Examiner*—Nathan Kaufman

*Attorney, Agent, or Firm*—Craig & Antonelli

[57] ABSTRACT

A semiconductor electronic circuit employs a semiconductor bias circuit, in which at least two inverter circuits are provided, each comprising a depletion type MOS transistor and an enhancement type MOS transistor, which are formed on a p-conductivity type semiconductor chip. The depletion type MOS transistor has its gate and source electrodes short-circuited and serves as a load transistor, while the enhancement type MOS type transistor has its drain electrode connected in series to the source electrode of the depletion type transistor. The input terminal and the output terminal of the first inverter circuit are connected to each other, and the voltage obtained at the output terminal is applied as a bias voltage to the input terminal of the second inverter circuit.

10 Claims, 11 Drawing Figures

SEMICONDUCTOR ELECTRONIC CIRCUIT WITH SEMICONDUCTOR BIAS CIRCUIT

BACKGROUND OF THE INVENTION

This invention relates to electronic circuits using semiconductor elements and more particularly to a semiconductor electronic circuit having a stable bias voltage circuit.

DESCRIPTION OF THE PRIOR ART:

Various amplifier circuits using semiconductor elements have been proposed in the art, among which is one using MOS field effect transistors (hereinafter briefly, MOS transistors) widely in use since it is easy to manufacture. A typical semiconductor amplifier circuit is an inverter circuit in which the drain terminal of a driver MOS transistor is connected in series to the source terminal of an MOS transistor which serves as a load transistor. The transfer function, i.e., the input-output voltage characteristic $V_I$–$V_O$ of this type of inverter circuit is represented by a dropping curve where, in general, the output voltage decreases with an increase in the input voltage. For the purpose of the following description, it will be understood that the $V_I$–$V_O$ characteristics including one having a portion where the output voltage is partially constant with an increase in the input voltage, is referred to as "dropping characteristic". This inverter circuit, when used as the usual amplifier circuit, is operated in such a manner that the operating point is located in the steeply sloped part on the dropping characteristic, and the bias voltage applied to the input terminal of the amplifier MOS transistor is adjusted to be set to this operating point.

In this inverter circuit, the amplification ratio becomes great as the input-output characteristic curve becomes steeper. However, the operating point, once adjusted, tends to deviate due to small temperature changes or power source variations. Deviation in the operating point, even if it is very small, serves as a cause of misoperation or waveform distortion, and makes the circuit unable to maintain normal amplifying operation. Hence, to operate the inverter circuit at a sufficiently high amplification ratio, it is generally necessary to provide a highly stable bias voltage circuit. Practically, however, a substantially desirable bias voltage circuit has been hard to realize.

To obtain an improved amplifier circuit in the prior art, it has been proposed to provide a compositionally extraneous circuit for use as the bias circuit. However, this gives rise to problems, particularly in connection with integrated circuit techniques. Namely, when many amplifier circuits are formed on a single semiconductor chip, circuit layout is inevitably complicated, and the integration density is lowered.

SUMMARY OF THE INVENTION

In view of the foregoing, the present invention has for its principal object the provision of an improved semiconductor electronic circuit characterized in that at least four active elements, each comprising an input electrode, an output electrode and a common electrode, are formed on one semiconductor ship, the input electrode and the common electrode of the second active element are connected to each other and then to the output electrode of the first active element; a drive voltage is supplied between the output electrode of the second active element and the common electrode of the first active element, the second active element is operated as a load for the first active element thereby forming at least two inverter circuits, each capable of producing at its output electrode an output signal which decreases with an increase in the input signal applied to the input electrode of the first active element. The input and output electrodes of the first active element of the first inverter circuit are connected to each other by way of a first connection means comprising a direct connection line or a suitable element. The output electrode of the first active element of the first inverter circuit and the input electrode of the first active element of the second inverter circuit are connected to each other by way of a second connection means comprising a direct connection line or a suitable element, and thus the output voltage from the first inverter circuit is utilized as the input bias voltage for the second inverter circuit.

According to this invention, the active element refers to a bipolar transistor and also to a field effect transistor. When it is a bipolar transistor, the base, collector and emitter correspond to the foregoing input electrode, output electrode and common electrode, respectively. Similarly, for a field effect transistor, the gate, drain and source correspond to said input, output and common electrodes respectively.

Various further and more specific objects, features and advantages of the invention will appear from the description given below, taken in conjunction with the accompanying drawings illustrating by way of example preferred embodiments of the invention.

DESCRIPTION OF THE PREFERRED EMBODIMENTS

Figure 1:
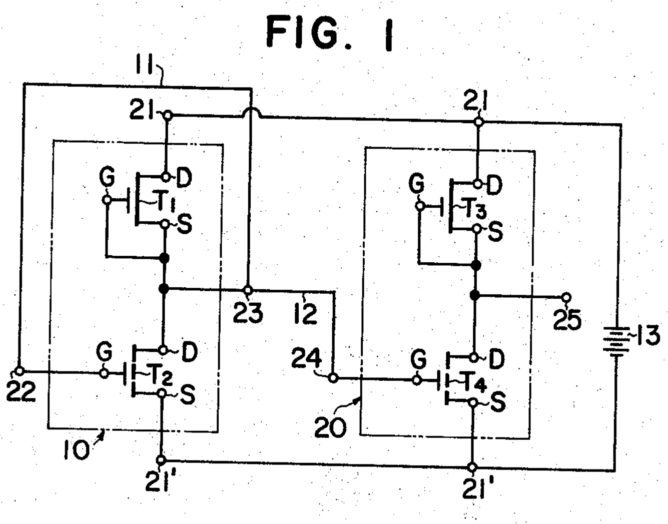
FIG. 1 is a schematic circuit diagram of an amplifier circuit embodying this invention.

Referring now to FIG. 1, there is illustrated an amplifier circuit embodying this invention. This amplifier circuit comprises a bias circuit 10 and an amplifier circuit 20, which are constituted of MOS field effect transistors. It is to be noted that the MOS transistor used in the embodiments disclosed in this specification is an element formed, for example, on a silicon substrate of p-type conductivity wherein the current conducting path (generally, channel) directly beneath the gate is of n-conductivity type. The depletion type MOS transistor (hereinafter briefly, D type MOS transistor) in this specification refers to an element in which current can flow between the drain and source even while the gate voltage is zero. Also, the enhancement type MOS transistor (hereinafter briefly, E type MOS transistor) is an element in which no current flows between the drain and source unless gate voltage is present. Each of the bias circuit 10 and the amplifier circuit 20 comprises an inverter circuit in which the drains D of E type transistors $T_2$ and $T_4$ are connected to the gates G and sources S of D type MOS transistors $T_1$ and $T_3$ respectively, each D type MOS transistor having its gate connected directly to its source. In the bias circuit 10, the input terminal 22 disposed at the gate G is connected through a first connection means 11 to the output terminal 23 disposed at the drain D. The output terminal 23 is connected through a second connection means 12 to the input terminal 24 of the amplifier circuit 20. The input terminal 24 is disposed at the gate of transistor $T_4$, and the output terminal 25 from which an output signal is derived is disposed at the drain D of transistor $T_4$. The numeral references 21 and 21′ denote terminals across which a drive power source 13 is connected.

Figure 2:
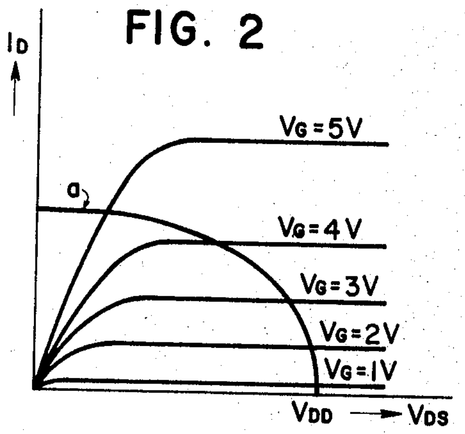
FIG. 2 is a characteristic diagram of an inverter circuit useful for illustrating the amplifying functions in accordance with the teachings of this invention.
Figure 3:
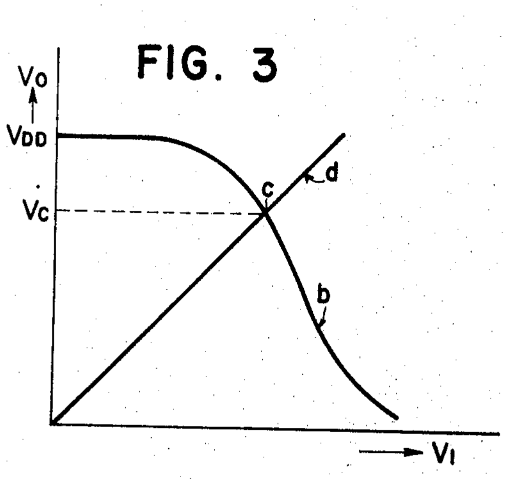
FIG. 3 is an input-output characteristic diagram of an amplifier circuit useful for illustrating the operation in accordance with this invention, FIGS. *4a* through *4d* are schematic block diagrams showing part of an amplifier circuit embodying this invention, FIGS. *5a* and *5b* are schematic circuit diagrams showing another embodiment of the invention wherein a high impedance device is disposed between the bias circuit and the amplifier circuit.

The operating features of the amplifier circuit comprising the bias circuit 10 and amplifier circuit 20 will become clear from the following description taken by reference to FIGS. 2 and 3 wherein FIG. 2 shows the source-drain voltage $V_{KS}$ vs. drain current $I_D$ characteristic (briefly, $V_{DS}$–$I_D$ characteristic as is generally called), for various parameters of gate voltage $V_G$, of one of the MOS transistors such as, for example, E type MOS transistor $T_4$, taken as a single transistor element. The D type MOS transistor $T_3$ wherein the gate and the source are short-circuited is used as a load for E type MOS transistor $T_4$. The load characteristic of the D type MOS transistor $T_3$ is indicated by the curve *a* in FIG. 2. In FIG. 3, the curve *b* represents the input-output characteristic $V_I$–$V_O$ ($V_i$ an input signal applied to the input terminal 24, and $V_O$: an output signal appearing at the output terminal 25) of the inverter circuit 20 comprising the D type MOS transistor $T_3$ and E type MOS transistor $T_4$. This characteristic is obtained by plotting the points at which the load curve of a D type MOS transistor $T_3$ crosses the $V_{DS}$–$I_D$ curve of E type MOS transistor $T_4$, using the gate voltage $V_G$ as a parameter. In contrast to a linear load characteristic of a resistance element in general, the $V_{DS}$–$I_D$ characteristic at a constant gate voltage is given in a ballistic curve as indicated by the reference a in FIG. 2, which is substantially a load characteristic of the circuit using D type MOS transistor. In other words, the input-output characteristic of the amplifier circuit using an E type MOS transistor can be steep enough to make the amplifier circuit operable at a high amplification ratio.

In the bias circuit 10, the voltage at the input terminal is equal to that at the output terminal, since the inverter circuit comprising the D type MOS transistor $T_1$ and the E type MOS transistor $T_2$ has its input and output terminals 22 and 23 connected to each other. The D type MOS transistor $T_1$ and the E type MOS transistor $T_2$ are formed on one semiconductor chip where the D type MOS transistor $T_3$ and the E type MOS transistor $T_4$ are also formed. Hence, the characteristics of the transistors $T_1$ and $T_2$ are nearly the same as those of the transistors $T_3$ and $T_4$ respectively. This means that the input-output characteristic of the inverter circuit of the bias circuit 10 is nearly the same as that indicated by the curve *b* in FIG. 3. Accordingly, the potential at the output terminal 23 of the bias circuit 10 is equal to the voltage $V_c$ at the point c at which the linear line d with a gradient of 45° passing through the origin crosses the input-output characteristic curve *b* of the inverter circuit. Because the characteristic of the inverter circuit of the bias circuit 10 is nearly the same as that of the amplifier circuit 20, there is little possibility of causing deviation in the bias set point, even if the input-output characteristic of each of the inverter circuit is deformed or deviates, due to variations in temperature or power source voltage. More specifically, the bias set point on the steeply sloped portion of the characteristic curve is determined not by the input voltage, but by the linear load characteristic. Hence, even if the characteristic curve itself is deformed or deviates, the amplifier is operable at a high amplification ratio as long as the load characteristic curve crosses said steeply curved portion. According to an aspect of the invention, a certain number of amplifier circuits are connected directly one after another into several stages in order to obtain a greater amplification in the manner as will be described later. These amplifiers are constructionally the same and formed on a common chip and, hence any deformation or deviation in the input-output characteristic is common to all the amplifier circuits. This is why the operating point on the characteristic curve cannot be different for the individual amplifier circuits. By virtue of this feature it is possible to maintain a stable bias voltage supply from the bias circuit 10 to the input terminal 24 of the amplifier circuit 20. In the above embodiment, the bias voltage can be set to a desired value by changing the input-output characteristic of the MOS transistor. For example, the threshold voltage of the MOS transistors $T_2$ and $T_4$ can be changed by changing the thickness of the oxide films in the gate regions of the MOS transistors $T_2$ and $T_4$. Thus, it is possible to change the input-output characteristics of these transistors. By so, changing the input-output characteristic, the point at which the input-output characteristic curve *b* crosses the linear characteristic *d* is changed and the bias voltage is accordingly changed. Also the linear characteristic *d* may be changed without changing the input-output characteristic of MOS transistor in the following manner.

Figure 4A:
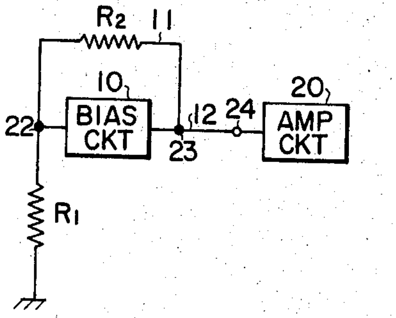
Figure 4B:
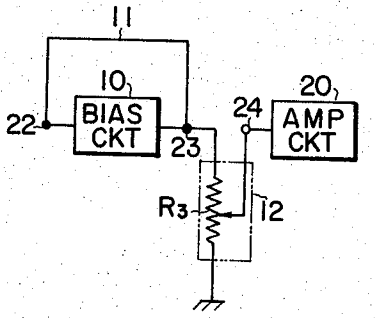

Referring to FIGS. 4*a* through 4*d*, there are shown in block form the inverter circuits which constitute the bias circuit 10 and the amplifier circuit 20 of FIG. 1. FIG. 4*a* shows an arrangement wherein the input and output terminals of the bias circuit are bridged by a resistor $R_2$ which is to serve as the first connection means, and the input terminal of the bias circuit is grounded by way of a resistor $R_1$. When the resistance values of the resistors $R_1$ and $R_2$ are changed, the potentials at the input terminals 22 and the output terminals 23 of the bias circuit are changed. Thus, by changing these potentials, the gradient of the linear line of the load characteristic as shown in FIG. 3 can be changed. The gradient of the linear characteristic can also be changed in such manner that, as shown in FIG. 4*b*, the bias voltage supplied from the bias circuit 10 is linearly changed by changing the resistance value of a slide resistor $R_3$ which is to serve as the second connection means. The bias voltage is then supplied to the amplifier circuit 20.

Figure 4C:
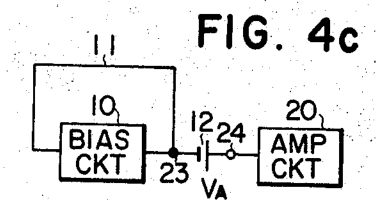
Figure 4D:
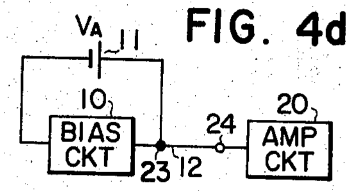

Further, according to the invention, the bias voltage can be determined without changing the gradient of the linear characteristic *d*. For this operation, the linear line *d* is parallel-shifted to change the position of the point at which the linear line *d* crosses the input-output characteristic curve. In practice, for example, a DC source $V_A$ is used as the second or first connection means inserted between the output terminal 23 of the bias circuit and the input terminal of the amplifier circuit as shown in FIG. 4*c*, or between the input and output terminals 22 and 23 of the bias circuit as shown in FIG. 4*d*. The prior art techniques of element design or circuit design will make it readily possible to suitably adjust said input-output characteristic or load characteristic.

As described above, the output voltage $V_c$ from the bias circuit 10 can always be used as an adequate bias voltage to the amplifier circuit 20. Hence, even a very small input signal applied to said input terminal 24 does not deviate from the desired operating point and can be appropriately amplified.

Since the amplifier 20 is operable at a high amplification ratio, its input-output characteristic curve is considerably steep. In the prior art, the variation in the bias set point is about 30 percent when the gradient of the input-output characteristic curve is at a gain of 3 to 20 dB. According to the present invention, the bias set point variation is about 3 percent at the same characteristic gradient.

Figure 5A:
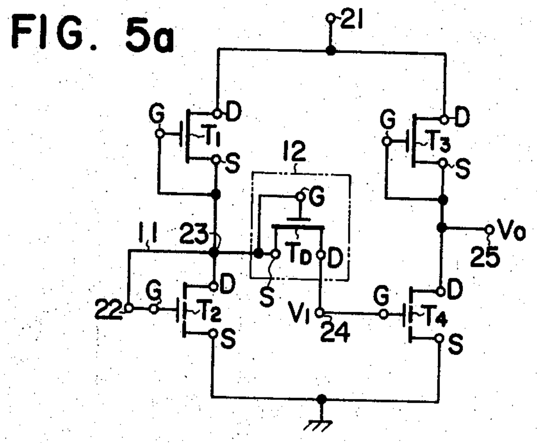
Figure 5B:
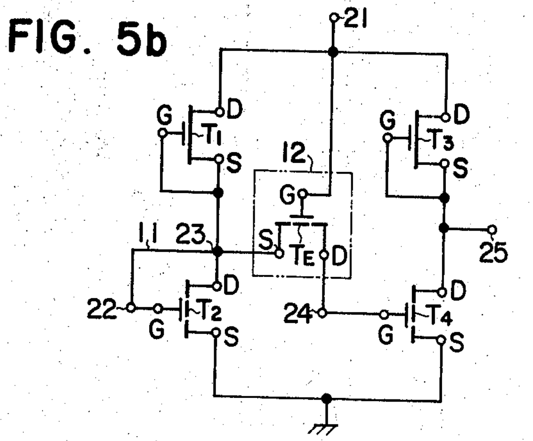

According to the invention, a high impedance MOS transistor may be used as the second connection means which is inserted between the terminals 23 and 24, so as not to allow the signal applied to the input terminal 24 of the amplifier circuit 20 to be reversely transmitted to the bias circuit 10 to cause undesirable effects. FIG. 5*a* shows an arrangement wherein a D type MOS transistor $T_D$ is disposed between the output terminal 23 of the bias circuit 10 and the input terminal 24 of the amplifier circuit 20. The source S and gate G of the transistor $T_D$ are short-circuited and then connected to the terminal 23, and the drain D is connected to the terminal 24. Since this transistor is a D type MOS the element $T_D$ serves as a high impedance resistor when its source S and gate G are short-circuited. FIG. 5*b* shows another arrangement wherein an E type MOS transistor $T_E$ is inserted as a connection means between said output terminal 23 and input terminal 24, and its gate G is connected to the power supply terminal 21. If the gate G and source S are short-circuited, this MOS transistor $T_E$ will not allow the flow drain current $I_D$. To permit flow of drain current, the gate G is to be connected to the power supply terminal 21, so that the gate G receives the necessary voltage. It is apparent that a resistance element may be used in place of said MOS transistor $T_D$ or $T_E$.

Figure 6:
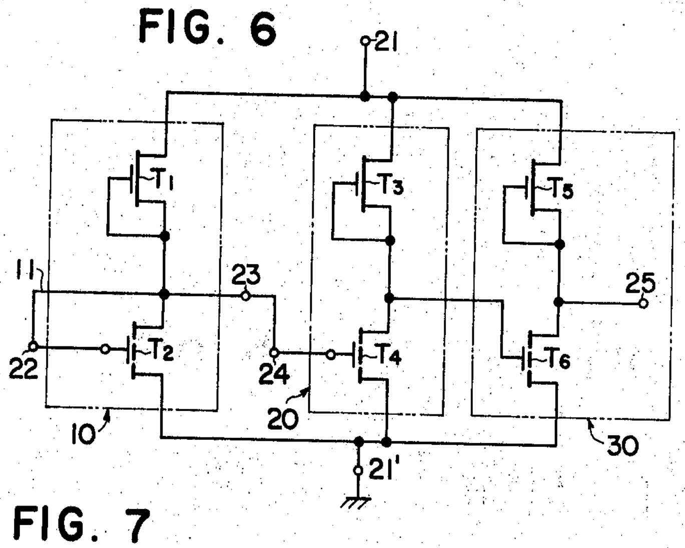
FIG. 6 is a schematic circuit diagram showing another embodiment of the invention wherein amplifier circuits are connected in the form of a multistage circuit.

FIG. 6 shows an amplifier circuit embodying this invention wherein plural amplifiers are connected in a multistage relationship. More specifically, in FIG. 6, an amplifier circuit 30 is connected to the output terminal of another amplifier circuit 20 which is as described by referring to FIG. 1. The transistors $T_2$, $T_4$ and $T_6$ are supposed to have nearly the same characteristics as are the transistor $T_1$, $T_3$ and $T_5$. The bias voltage from the bias circuit 10 is set to the point at which the input and output voltages of the inverter circuit are equal to each other as described previously. Therefore, the DC level of the output voltage of the amplifier circuit 20 which comprises an inverter circuit, whose characteristic is nearly the same as that of the inverter circuit of the bias circuit 10, is equal to the bias voltage level. Similarly, as for the amplifier circuit 30, it can be said that the output voltage level is equal to the bias voltage level. Therefore, the output DC level at the output terminal 25 must be equal to the bias voltage level. This is why, even if many amplifier circuits are connected in multistage form the output DC level of the amplifier in the last stage is equal to the bias level in the first stage and, hence, the invention provides a high gain amplifier circuit operable without deviating the operating point.

Figure 7:
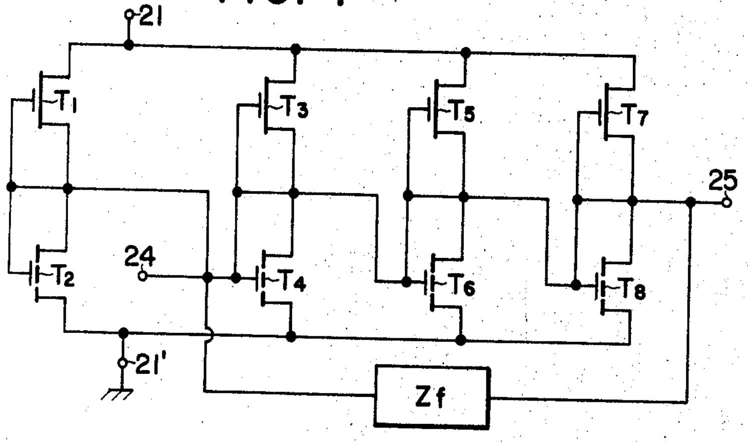
FIG. 7 is a schematic circuit diagram showing another embodiment of the invention wherein a negative feedback is applied across the input and output terminals of the amplifier circuit through a load impedance.

FIG. 7 shows another embodiment of the invention wherein the output signal after three stages of amplifiers is negatively fed back to the input terminal. The references $T_7$ and $T_8$ denote transistors used in the third stage amplifier. Other references in FIG. 7 indicate similar elements shown by identical references in FIG. 6. Negative feedback control such as mentioned above is well-known in the art and use for the purpose of stabilizing the level of the amplifier gain. A noteworthy advantage of this embodiment is that negative feedback can be more easily provided through a load Zf than in the prior art because, as disclosed by reference to FIG. 6, the DC level at the input terminal 24 and that at the output terminal 25 are kept equal.

In the foregoing embodiments, the amplifier circuit using field effect transistors has been considered. The invention is not limited to this example. What the invention emphasizes is its provision of an amplifier circuit operable in the input-output characteristic where the output is decreased with increase in the input as illustrated in FIG. 3. Hence, by connecting between the input and output terminals, a useful bias circuit can be realized. According to the invention, bipolar transistors may be used in place of field effect transistors. In such a case, the base of each bipolar transistor may be considered as the gate of a field effect transistor, the collector as the drain, and the emitter as the source. It is apparent that the bias circuit of the invention is capable of supplying an adequate bias to a logic digital circuit such as diode-transistor logic (generally DTL) and transistor-transistor logic (TTL).

Furthermore, instead of MOS transistors, junction type field effect transistors, bipolar transistors or the like may be used. For the purpose of this invention, it is apparent that a plurality of suitable transistors may be formed integrally on a semiconductor chip.

As has been specifically described above, the present invention makes it possible to supply a stable bias voltage to the amplifier circuit part by the use of a very simple circuit arrangement, and thus to realize an economical and highly stable amplifier circuit.

The invention is particularly useful and practical when applied to integrated circuits as well as to large scale integration in which many elements are formed on one semiconductor chip.

It will readily be apparent to those skilled in the art that many changes and variations may be made in the circuit configurations illustrated herein without departing from the spirit and scope of the present invention.

We claim:

1. A semiconductor electronic circuit comprising:

a plurality of inverter circuits, each of which includes:
first and second active elements, each active element having:
an input electrode,
an output electrode,
a common electrode; and
an input terminal and an output terminal; and wherein
said input and output terminals of each inverter circuit are respectively connected to the input electrode and output electrode of the first active element, the output electrode of said first active element is connected to the input and common electrodes of said second active element, the input and common electrodes of said second active element being connected directly together;
first connection means for connecting the input terminal of a first inverter circuit of said plurality to the output terminal thereof;
second connection means for connecting the output terminal of said first inverter circuit to the input terminal of a second inverter circuit of said plurality and
means for supplying a drive voltage across the common electrode of the first active element and the output electrode of the second active element of each inverter circuit;
whereby a signal at the output terminal of said first inverter circuit provides an input bias voltage for said second inverter circuit, so as to stabilize the bias voltage supplied to said second inverter circuit.

2. A semiconductor electronic circuit according to claim 1, wherein one of said connection means comprises a conductive wire directly connecting the input and output terminals together.

3. A semiconductor electronic circuit according to claim 1, wherein one of said connection means comprises means for resistively coupling the input and output terminals together.

4. A semiconductor electronic circuit according to claim 1, wherein each of said first and second connection means comprises a conductive wire directly connecting the output and input terminals together.

5. A semiconductor electronic circuit according to claim 1, wherein one of said connection means comprises a D.C. voltage source providing a level shift voltage between the output and input electrode.

6. A semiconductor electronic circuit according to claim 1, wherein said first active element comprises an enhancement-type MOSFET and said second active element comprises a depletion type MOSFET.

7. A semiconductor electronic circuit according to claim 6, wherein said second connection means comprises a depletion type MOSFET having its source and gate electrodes connected directly to each other and to the output terminal of said first inverter circuit, and its drain electrode connected to the input terminal of said second inverter circuit.

8. A semiconductor electronic circuit according to claim 6, wherein said second connection means comprises an enhancement-type MOSFET having its source and drain electrodes connected to the output terminal of said first inverter circuit and to the input terminal of said second inverter circuit, respectively.

9. A semiconductor electronic circuit according to claim 1, further including at least one first additional inverter circuit internally identical with said second inverter circuit and having its input terminal directly connected to the output terminal of said second inverter circuit and being connected to said drive voltage supplying means in the same manner as said second inverter circuit.

10. A semiconductor electronic circuit according to claim 9, further including a second additional inverter circuit internally identical with and connected to said first additional circuit in the same manner that said first additional circuit is connected to said second inverter circuit, and further including means for negatively feeding back the output of said second additional inverter circuit to the input of said second inverter circuit.

* * * * *